United States Patent
Wang et al.

(10) Patent No.: US 10,205,132 B2
(45) Date of Patent: Feb. 12, 2019

(54) OLED DISPLAY PANEL AND METHOD FOR PACKAGING AN OLED DISPLAY PANEL WITH A COVERING LAYER HAVING A CONCAVE STRUCTURE

(71) Applicants: BOE TECHNOLOGY GROUP CO., LTD., Beijing (CN); ORDOS YUANSHENG OPTOELECTRONICS CO., LTD., Ordos (CN)

(72) Inventors: Lina Wang, Beijing (CN); Zifeng Wang, Beijing (CN); Liang Zhang, Beijing (CN); Bing Li, Beijing (CN); Xuansheng Wang, Beijing (CN); Ang Xiao, Beijing (CN)

(73) Assignees: BOE Technology Group Co., Ltd., Beijing (CN); Ordos Yuansheng Optoelectronics Co., Ltd., Ordos (CN)

( * ) Notice: Subject to any disclaimer, the term of this patent is extended or adjusted under 35 U.S.C. 154(b) by 10 days.

(21) Appl. No.: 15/325,992

(22) PCT Filed: Jun. 30, 2016

(86) PCT No.: PCT/CN2016/087891
§ 371 (c)(1),
(2) Date: Jan. 12, 2017

(87) PCT Pub. No.: WO2017/117931
PCT Pub. Date: Jul. 13, 2017

(65) Prior Publication Data
US 2018/0151846 A1    May 31, 2018

(30) Foreign Application Priority Data
Jan. 4, 2016    (CN) .......................... 2016 1 0003820

(51) Int. Cl.
*H01L 51/56* (2006.01)
*H01L 51/52* (2006.01)

(52) U.S. Cl.
CPC .............. *H01L 51/56* (2013.01); *H01L 51/52* (2013.01); *H01L 51/524* (2013.01); *H01L 2251/566* (2013.01)

(58) Field of Classification Search
CPC ............ H01L 51/0545; H01L 51/0541; H01L 51/5012; H01L 51/56
See application file for complete search history.

(56) References Cited

U.S. PATENT DOCUMENTS

| 8,823,254 | B2 * | 9/2014 | Ohta | .................... | G02B 3/0056 313/503 |
| 9,368,856 | B2 * | 6/2016 | Lee | ......................... | H01P 11/00 |

(Continued)

FOREIGN PATENT DOCUMENTS

| CN | 1505443 A | 6/2004 |
| CN | 102709479 A | 10/2012 |

(Continued)

OTHER PUBLICATIONS

Office Action from corresponding Chinese Application No. 201610003820.5, dated Jan. 22, 2017 (9 pages).

(Continued)

*Primary Examiner* — Quoc Hoang
(74) *Attorney, Agent, or Firm* — Harness, Dickey & Pierce, P.L.C.

(57) ABSTRACT

The present disclosure relates to a method for packaging an OLED display panel, an OLED display panel and an OLED display device. The method for packaging an OLED display panel comprises: providing a substrate and a cover plate, and forming a covering layer on the substrate, wherein the covering layer has a concave structure. The method further (Continued)

comprises forming another covering layer having a convex structure or forming an adhesive on the cover plate, wherein a bump of the convex structure or the adhesive may be accommodated in a recess of the concave structure.

14 Claims, 5 Drawing Sheets

(56) References Cited

U.S. PATENT DOCUMENTS

| | | | |
|---|---|---|---|
| 2014/0126131 A1* | 5/2014 | Lee | G06F 1/1601 361/679.3 |
| 2014/0138651 A1 | 5/2014 | Oh | |
| 2017/0214000 A1* | 7/2017 | Li | H01L 51/5256 |

FOREIGN PATENT DOCUMENTS

| | | |
|---|---|---|
| CN | 103022374 A | 4/2013 |
| CN | 203760519 U | 8/2014 |
| CN | 104037196 A | 9/2014 |
| CN | 104064687 A | 9/2014 |
| CN | 104157799 A | 11/2014 |
| CN | 104538555 A | 4/2015 |
| CN | 105576148 A | 5/2016 |

OTHER PUBLICATIONS

Written Opinion of the International Searching Authority from corresponding PCT Application No. PCT/CN2016/087891, dated Sep. 28, 2016 (5 pages).

* cited by examiner ns OLED DISPLAY PANEL AND METHOD FOR PACKAGING AN OLED DISPLAY PANEL WITH A COVERING LAYER HAVING A CONCAVE STRUCTURE

CROSS-REFERENCE TO RELATED APPLICATION

This application claims priority of Chinese Patent Application No. 201610003820.5, which was filed on Jan. 4, 2016, the disclosures of which are incorporated herein by reference in their entirety.

TECHNICAL FIELD

The present disclosure relates to the field of display technologies, and more particularly, to the field of OLED. In particular, the present disclosure relates to a method for packaging an OLED display panel, an OLED display panel and an OLED display device.

BACKGROUND

Compared with other types of display devices (for example, liquid crystal display units), as next-generation displays, OLED display devices may be extensively studied and preliminarily used due to their advantages of light and thin features, low power consumption, high contrast ratio, high color gamut and so on. Compared with liquid crystal display devices, another advantage of the OLED display devices is that the OLED display devices do not need back lighting.

However, a disadvantage of the OLED display devices consists in sensitivity to air and humidity. A majority of organic substances of an OLED light emitting layer are very sensitive to pollutants, $O_2$ and water vapor in the atmosphere, which may directly cause problems such as deterioration of organic light-emitting materials, decrease of a luminous efficiency, abnormal light emission or failure in light emission, and also may cause oxidation and corrosion of metal electrodes. Therefore, packaging technologies have a direct effect on stability and life span of the OLED display devices.

At present, a cover plate being additionally mounted on a backplate may be used for packaging an OLED display device, and generally resin or glass cement and so on may be used to bond the backplate and the cover plate, but the packaging effect is not ideal.

SUMMARY

An objective of the present disclosure is to provide a method for packaging an OLED display panel.

A first aspect of the present disclosure provides a method for packaging an OLED display panel, including: providing a substrate and a cover plate, and forming a covering layer on the substrate, wherein the covering layer has a concave structure.

Optionally, the forming a covering layer on the substrate includes: forming a covering layer patterned to be a frame-shaped structure on the substrate; and removing a central portion of a frame of the frame-shaped structure to form the concave structure.

Optionally, the forming a covering layer on the substrate includes: forming a first covering layer patterned to be a frame-shaped structure; and disposing a second covering layer on an edge portion of the first covering layer so that the first covering layer and the second covering layer form the concave structure.

Optionally, the method for packaging an OLED display panel further includes forming another covering layer on the cover plate, wherein the another covering layer has a convex structure.

Optionally, the forming another covering layer on the cover plate includes: forming another covering layer patterned to be a frame-shaped structure on the cover plate; and removing an edge portion of a frame of the frame-shaped structure to form the convex structure.

Optionally, the forming another covering layer on the cover plate includes: forming a third covering layer patterned to be a frame-shaped structure on the cover plate; and disposing a fourth covering layer on a central portion of the third covering layer such that the third covering layer and the fourth covering layer form the convex structure.

Optionally, the method for packaging an OLED display panel further includes forming the covering layer or the another covering layer by using a mask plate having a hollowed-out portion, wherein the covering layer or the other covering layer is deposited at the hollowed-out portion.

Optionally, the method for packaging an OLED display panel further includes forming an adhesive on the cover plate, wherein a recess of the concave structure corresponds to the adhesive in location and size so that the adhesive is accommodated in the recess after the substrate and the cover plate are bonded together.

Optionally, the adhesive includes glass cement.

Optionally, the method for packaging an OLED display panel further includes forming an adhesive on the cover plate, wherein a recess of the concave structure corresponds to the adhesive in location and size so that the adhesive is accommodated in the recess after the substrate and the cover plate are bonded together.

Optionally, according to the method for packaging an OLED display panel, the recess of the concave structure corresponds to a bump of the convex structure in location and size such that the bump is accommodated in the recess after the substrate and the cover plate are bonded together.

Optionally, the covering layer includes a low-melting-point material.

Optionally, the substrate is an array substrate, the substrate and the cover plate include glass, the covering layer is a silicon-containing oxide, and the method further includes: disposing an organic light-emitting material on the covering layer; bonding the substrate with the cover plate; sintering; cutting the substrate and the cover plate bonded together into panels; disposing a curable auxiliary adhesive around a bonding location of the panel; and forming an auxiliary adhesive layer by curing the auxiliary adhesive.

Another objective of the present disclosure is to provide an OLED display panel.

A second aspect of the present disclosure provides an OLED display panel, which has a substrate, a covering layer formed on the substrate and a cover plate, wherein the covering layer has a concave structure.

Optionally, the OLED display panel further includes another covering layer between the cover plate and the covering layer, wherein the another covering layer has a convex structure, and a bump of the convex structure is accommodated in a recess of the concave structure.

Optionally, the OLED display panel further includes an adhesive between the cover plate and the covering layer, wherein the adhesive is accommodated in the recess of the concave structure.

Optionally, the substrate and the cover plate include glass, and the covering layer includes a silicon-containing oxide.

Still another objective of the present disclosure is to provide an OLED display device.

A third aspect of the present disclosure provides an OLED display device, wherein the system includes the OLED display panel.

BRIEF DESCRIPTION OF THE DRAWINGS

To describe technical solutions of the embodiments of the present disclosure more clearly, the following will briefly introduce the accompanying drawings of the embodiments. It should be known that the accompanying drawings in the following description merely involve with some embodiments of the present disclosure, but not limit the present disclosure, in which.

DETAILED DESCRIPTION

To make objectives, technical solutions, and advantages of the embodiments of the present disclosure clearer, the following will clearly and completely describe the technical solutions of the embodiments of the present disclosure with reference to the accompanying drawings. Apparently, the described embodiments are some but not all of the embodiments of the present disclosure. All other embodiments obtained by a person skilled in the art based on the described embodiments of the present disclosure without creative efforts shall fall within the protection scope of the present disclosure.

When an element and an embodiment of the present disclosure are introduced, the articles "a", "an", "the" and "said" are intended to indicate that one or more elements are present. The terms "comprising", "including", "containing" and "having" are intended to be inclusive and mean that there may be additional elements other than the listed elements.

For the purpose of surface description hereinafter, as direction-calibrated in the accompanying drawings, the terms "above", "below", "left", "right", "vertical", "horizontal", "top", "bottom" and derivatives thereof shall relate to the present disclosure. The terms "covered with", "on top of", "positioned on", or "positioned on top of" mean that, for example, a first element of a first structure is on a second element of a second structure, wherein an intermediate element such as an interface structure may exist between the first element and the second element. The term "contact" means that, for example, the first element of the first structure and the second element of the second structure are connected, and other elements may exist or not exist on the interfaces of the two elements.

Figure 1:
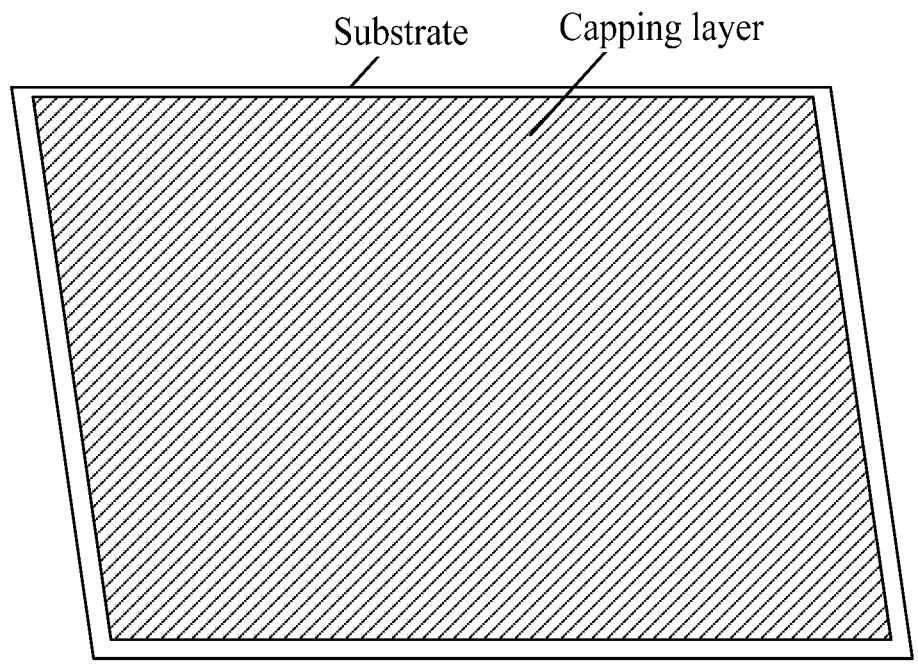
FIG. 1 is a schematic view illustrating a substrate on which a covering layer is deposited according to an embodiment of the present disclosure.

FIG. 1 illustrates a substrate on which a covering layer is deposited according to an embodiment of the present disclosure. After the cover plate is processed in a similar way, the obtained cover plate on which a covering layer is deposited is similar, in structure, to the substrate on which a covering layer is deposited. Therefore, the schematic view of the cover plate on which a covering layer is deposited is not separately drawn. In the embodiment as shown in FIG. 1, after the completion of the array fabrication and before disposing the organic light-emitting material, a covering layer is formed on surfaces of the substrate and the cover plate. According to the embodiments of the present disclosure, the substrate and the cover plate may adopt any material such as glass commonly used in the art. The substrate may be an array substrate containing at least one panel. Hereinafter, an exemplary description will be made by taking the array substrate as an example.

A thermal expansion coefficient and a bonding capacity of a thin film may be controlled by adjusting constituents and proportions of the covering layer. In view of sintering, the covering layer may include a low-melting-point material. In view of a material quality of the substrate, the covering layer may be made up of an amorphous material.

Optionally, the covering layer is an oxide layer, for example, a silicon-containing oxide $SiO_x$, or $SiO_x$ mixed with other metal oxides and nonmetal oxides. In case that the substrate is glass, a good covering effect may be achieved by using a silicon-containing oxide as the covering layer. It is to be pointed out that in the full text of the present disclosure, it is merely exemplary that the covering layer is an oxide layer, any other material suitably used as the covering layer may be disposed, not limited to an oxide. The oxide layer used as the covering layer may be deposited by a vapor deposition method such as physical vapor deposition or chemical vapor deposition, or may be deposited by other processes known in the art.

Figure 2:
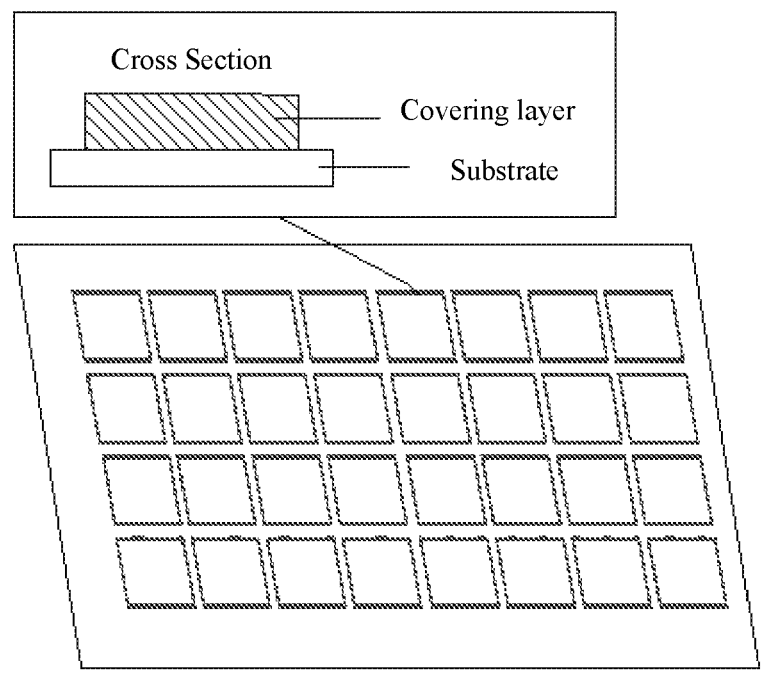
FIG. 2 is a schematic view illustrating a structure after a first etching according to an embodiment of the present disclosure.
Figure 3:
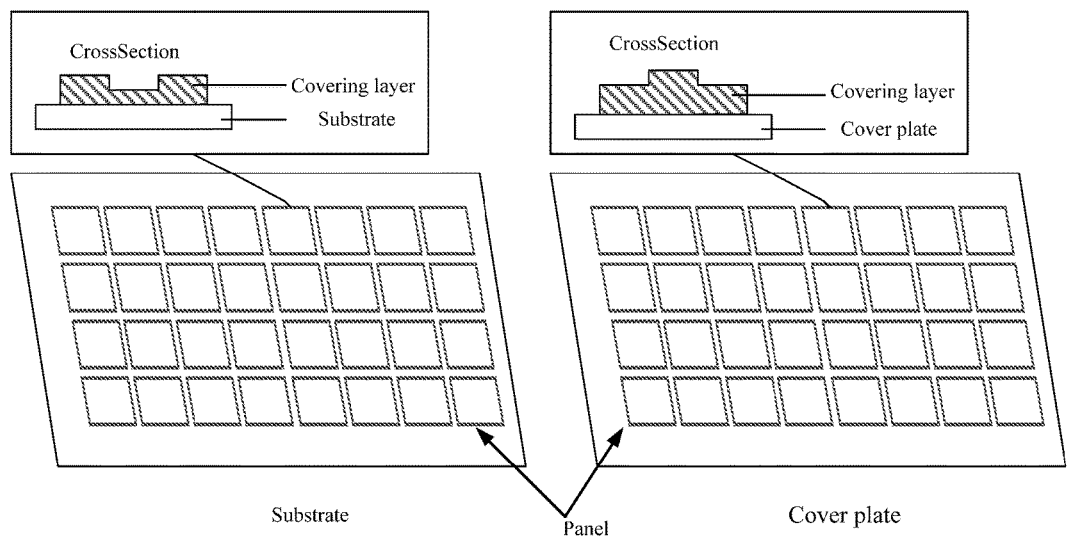
FIG. 3 is a schematic view illustrating a structure after a second etching according to an embodiment of the present disclosure.

FIG. 2 and FIG. 3 are schematic views of subsequently processing the structure in FIG. 1 to respectively generate a substrate on which a covering layer having a concave structure is formed and a cover plate on which another covering layer having a convex structure is formed.

As shown in FIG. 2, the substrate on which a covering layer is formed is processed so that a covering layer patterned to be a frame-shaped structure is formed on the substrate. The cover plate on which a covering layer is formed is also processed in a similar way, the patterned cover plate obtained is similar, in structure, to the patterned substrate. Therefore, the schematic view of the cover plate on which a covering layer is formed is not separately drawn.

In an embodiment, specifically, the substrate and the cover plate may be respectively etched for the first time. For example, a pattern as shown in FIG. 2 may be formed on the substrate successively by applying a photoresist, mask exposure, developing, etching, lift-off and so on, wherein the pattern may be a rectangular pattern formed at the edge of the panel. In a similar way, a similar pattern is obtained at a location on the surface of the cover plate corresponding to the substrate. According to packaging requirements, the frame-shaped structure of the covering layer may be a continuous or discontinuous frame, and the pattern is not limited to a rectangle.

As shown in FIG. 3, for the substrate, a central portion of a frame of the covering layer patterned to be a frame is removed to form the covering layer having the concave structure; and for the cover plate, an edge portion of a frame of a covering layer patterned to be a frame is removed to form another covering layer having the convex structure.

In an embodiment, specifically, the substrate and the cover plate may be respectively etched for the second time. For example, a patterning as shown in FIG. 3 may be formed on the panel successively by applying a photoresist, mask exposure, developing, etching, lift-off and so on. To the substrate, the central portion of the frame of its frame-shaped covering layer is removed so that a concave covering layer having a recess is formed at the edge of its panel. To the cover plate, the edge portion of the frame of its frame-shaped covering layer is removed so that a convex covering layer having a bump is formed at the edge of its panel. Furthermore, the recess of the concave covering layer corresponds to the bump of the convex covering layer in location and size so that the bump can be accommodated in the recess after the substrate and the cover plate are bonded together.

Figure 8A:
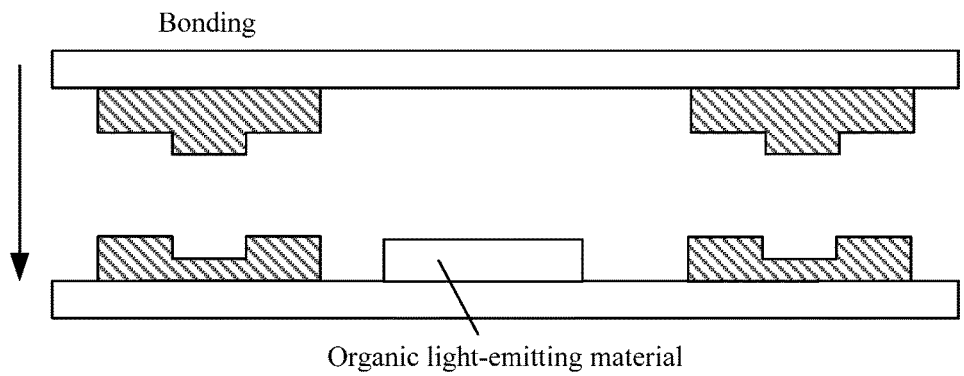
FIG. 8A is a schematic view illustrating a method for packaging an OLED display panel according to an example embodiment of the present disclosure.

Afterwards, an organic light-emitting material (see FIG. 8A) is plated, and subsequent processes such as evaporating are completed. For the sake of simplicity, no redundant description is made.

Figure 4:
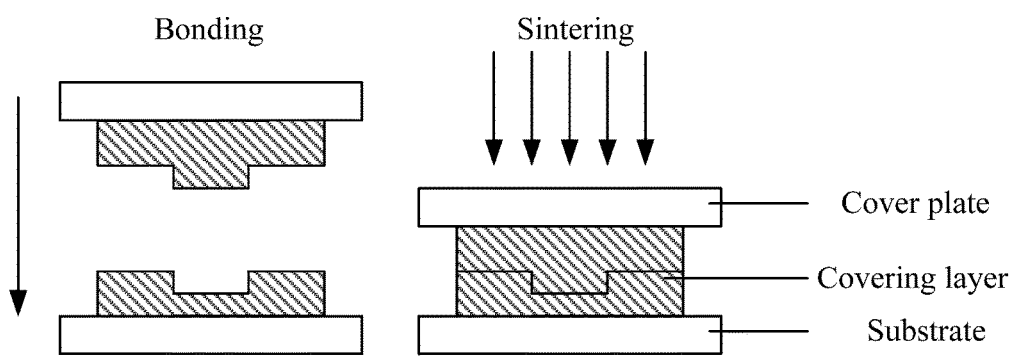
FIG. 4 is a schematic view illustrating bonding of a substrate and a cover plate according to an embodiment of the present disclosure.

Then, as shown in FIG. 4, the substrate and the cover plate are bonded together, and then preferably sintering is carried out. In an embodiment, specifically, the substrate and the cover plate are bonded together, and then a sintering treatment is performed on one side of the cover plate by using laser light. The covering layer is instantaneously melted at a high temperature, as previously mentioned, the covering layer on the substrate can be correspondingly engaged with that on the cover plate so that they are bonded together, and then they are cooled and cured.

Figure 8B:
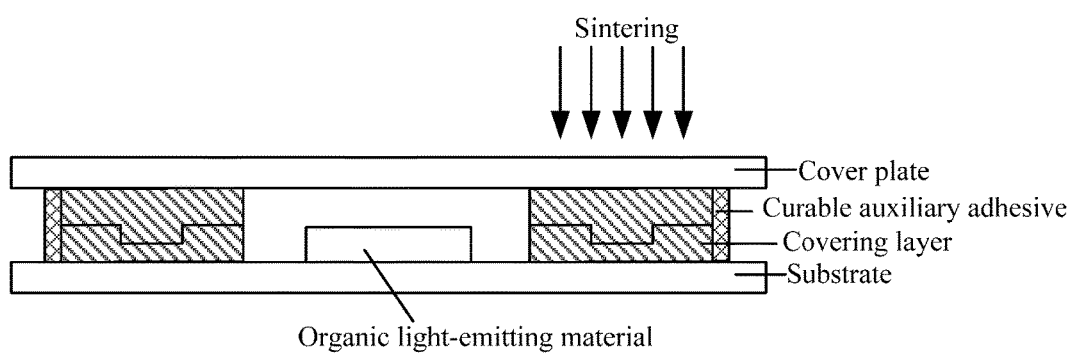
FIG. 8B is a schematic view illustrating a method for packaging an OLED display panel according to another example embodiment of the present disclosure.

Afterwards, the substrate and the cover plate bonded together are cut into a plurality of panels. A curable auxiliary adhesive (see FIG. 8B), for example, a thermally curable or light curable auxiliary adhesive such as an ultraviolet adhesive, is disposed around a bonding location (namely, a location where the cover plate and the substrate are bonded together) of a panel, an auxiliary adhesive layer is formed by curing, and internal protection of a display is enhanced.

Figure 5:
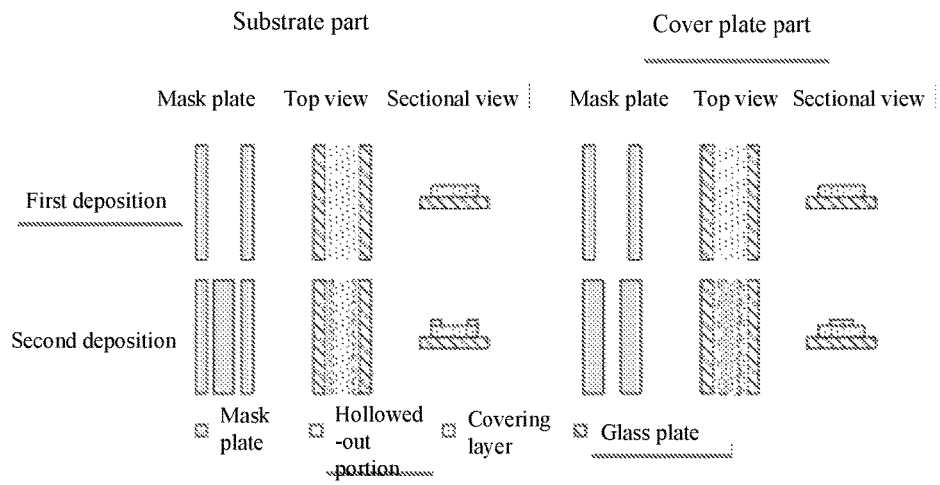
FIG. 5 is a schematic view illustrating a local shape of a mask plate and a structure of an oxide layer according to another embodiment of the present disclosure.

FIG. 5 illustrates another embodiment according to the present disclosure. As shown in FIG. 5, to the substrate part, a first covering layer patterned to be a frame-shaped structure is formed; and a second covering layer is disposed on an edge portion of the first covering layer so that the first covering layer and the second covering layer form the concave structure. To the cover plate part, a third covering layer patterned to be a frame-shaped structure is formed on the cover plate; and a fourth covering layer is disposed on a central portion of the third covering layer so that the third covering layer and the fourth covering layer form the convex structure.

The covering layer may be made up of any material suitably used as the covering layer, and the substrate may be an array substrate. An exemplary description is made hereinafter by taking an example in which the covering layer is an oxide layer, the substrate is an array substrate, and the substrate and the cover plate are made of glass. It is to be noticed that in this embodiment, as an example, both the substrate and the cover plate are glass plates. However, the substrate and the cover plate may be made of any material known to those skilled in the art, not limited to glass. Furthermore, the substrate and the cover plate may be made of the same material or of different materials.

In an embodiment, specifically, different masks may be respectively covered on the glass plates of the array substrate and the cover plate; and through twice vapor depositions (for example, physical vapor deposition), the substrate on which a covering layer having a concave structure is formed and the cover plate on which another covering layer having a convex structure is formed may be respectively obtained.

As shown in FIG. 5, deposition is respectively performed on the substrate and the cover plate by using a mask plate for the first time. To the deposition, a covering layer is deposited on the hollowed-out portion. To a portion not hollowed out, no covering layer is deposited due to obstruction of the mask. A deposition result is as shown in FIG. 5, to the substrate, a first covering layer is formed on the substrate through deposition for the first time, and the first covering layer has a similar frame-shaped structure with that of FIG. 2, wherein the frame-shaped structure may be a continuous or discontinuous frame, and the shape of the frame-shaped structure includes but is not limited to a rectangle. To the cover plate, a third covering layer is formed on the cover plate through deposition for the first time, and the third covering layer has a similar frame-shaped structure with that of FIG. 2, wherein the frame-shaped structure may be a continuous or discontinuous frame, and the shape of the frame-shaped structure includes but is not limited to a rectangle.

Afterwards, deposition is respectively performed on the substrate and the cover plate by using the mask plate for the second time. That is, another covering layer is respectively deposited on the substrate where the first covering layer is deposited and on the cover plate where the third covering layer is deposited. To the substrate, the shape of the mask for the second deposition is designed so that after the second deposition, a second covering layer can be deposited at the edge of the first covering layer, and a concave structure is formed by the first covering layer and the second covering layer. To the cover plate, the shape of the mask for the second deposition is designed so that after the second deposition, a fourth covering layer can be deposited on the central portion of the third covering layer, and a convex structure is formed by the third covering layer and the fourth covering layer.

An effect after twice depositions is as shown in FIG. 5. In FIG. 5, dotted box parts (namely, color emphasizing regions) in the vertical view respectively indicate the second covering layer and the fourth covering layer after twice depositions. The recess of the concave structure corresponds to the bump of the convex structure in location and size so that the bump can be accommodated in the recess after the substrate and the cover plate are bonded together.

Figure 6:
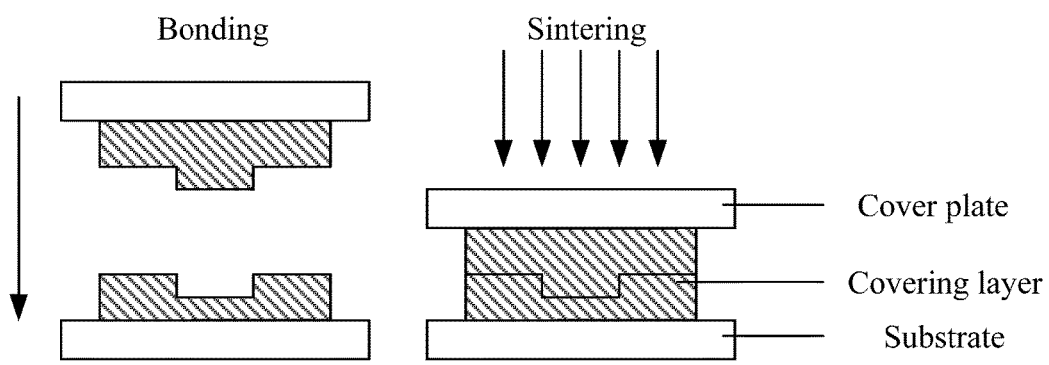
FIG. 6 is a schematic view illustrating bonding of a substrate and a cover plate according to still another embodiment of the present disclosure.

Afterwards, an organic light-emitting material is plated, and subsequent processes such as evaporating are completed. Then, as shown in FIG. 6, the substrate and the cover plate are bonded together and then are sintered. In an embodiment, specifically, the substrate and the cover plate are bonded together, and then a sintering treatment is performed on one side of the cover plate by using laser light. The covering layer is instantaneously melted at a high temperature, as previously mentioned, the covering layer on the substrate can be correspondingly engaged with the covering layer on the cover plate so that they are bonded together, and then they are cooled and cured.

Afterwards, the substrate and the cover plate bonded together are cut into panels. A curable auxiliary adhesive, for example, a thermally curable or light curable auxiliary adhesive such as an ultraviolet adhesive, is disposed around a bonding location (namely, a location where the cover plate and the substrate are bonded together) of a panel, an auxiliary adhesive layer is formed by curing, and internal protection of a display is enhanced.

Figure 7:
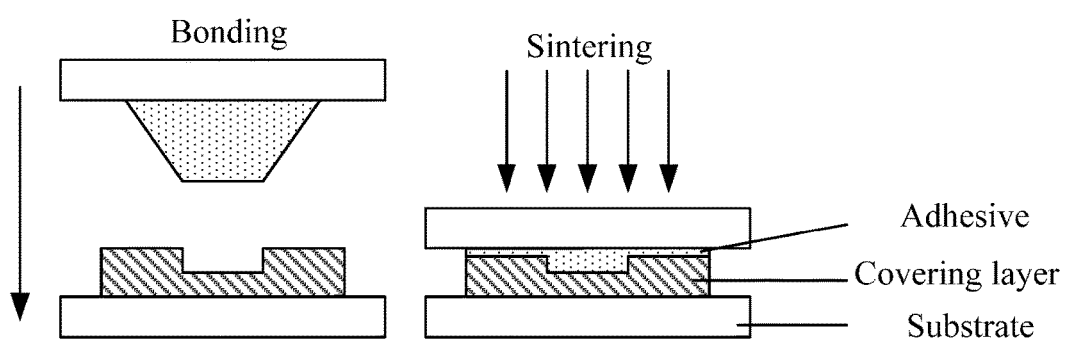
FIG. 7 is a schematic view illustrating bonding of a substrate and a cover plate according to still another embodiment of the present disclosure.

FIG. 7 illustrates another embodiment according to the present disclosure. In this embodiment, a covering layer having a concave structure is formed on the substrate according to the method as shown in FIG. 2, FIG. 3 or FIG. 5.

The covering layer may be made up of any material suitably used as the covering layer, including but not limited to an oxide layer. The substrate may be an array substrate. An exemplary description is made hereinafter by taking the substrate as an array substrate.

After completion of the array fabrication, a covering layer having a concave structure is formed on a backplate. An adhesive is coated on the cover plate. The recess of the concave structure corresponds to the adhesive in location and size so that the adhesive can be accommodated in the recess after the substrate and the cover plate are bonded together. The adhesive may be any suitable material known to those skilled in the art, including but not limited to glass cement.

Afterwards, the substrate and the cover plate are bonded together and then are sintered. After the substrate and the cover plate are bonded together, the adhesive is gathered in the recess of the concave structure on the substrate. A sintering treatment is performed on one side of the cover plate by using laser light. In the sintering process, the recess of the concave structure may keep temperature for the adhesive. In this way, a sintering effect may be effectively improved, which has a good effect in reducing sintering energy and time.

It is to be pointed out that the bump or the adhesive described herein can be accommodated in the recess, which includes: the bump or the adhesive can be partly or totally accommodated in the recess. A size relationship between the bump or the adhesive and the recess is determined according to actual requirements.

In the present disclosure, the concave structure of the covering layer may reduce air permeation space so that permeation of oxygen and water vapor is drastically reduced. A tooth profile design increases a contact area of a bonding location so that the bonding is firmer. A covering layer is respectively deposited on the substrate and the cover plate through vapor deposition, which overcomes a defect caused by nonuniformly coating an adhesive such as glass cement. To a film layer formed by vapor deposition, its patterning may be better controlled by means of a mask. If processes performed on the cover plate need to be reduced, a space limitation of the recess of the concave structure on the substrate may control a flow direction of an adhesive under pressure so that the adhesive is distributed more uniformly. The recess has a better heat preservation effect, which may provide a better sintering effect for the adhesive using relatively lower laser energy and reduce a laser sealing stress.

Certain specific embodiments have been described, and these embodiments are exhibited merely by examples and are not intended to limit the scope of the present disclosure. Indeed, the novel embodiments set forth herein may be implemented in a variety of other forms; in addition, various omissions, substitutions and changes can be made in the form of the embodiments set forth herein without departing from the spirit of the present disclosure. The appended claims and equivalents thereof are intended to cover this form or modification thereof that fall within the scope and spirit of the present disclosure.

What is claimed is:

1. A method for packaging an OLED display panel, the method comprising:
    providing a substrate and a cover plate;
    forming a covering layer on the substrate; and
    forming another covering layer on the cover plate, wherein the covering layer formed on the substrate has a concave structure, the another covering layer formed on the cover plate has a convex structure, and forming the covering layer on the substrate includes:
    forming the covering layer as a frame-shaped structure on the substrate and removing a central portion of a frame of the frame-shaped structure to form the concave structure; or
    forming a first covering layer as a frame-shaped structure and positioning a second covering layer on an edge portion of the first covering layer so the first covering layer and the second covering layer form the concave structure.

2. The method for packaging an OLED display panel according to claim 1, wherein forming another covering layer on the cover plate comprises:
    forming the another covering layer as a frame-shaped structure on the cover plate; and
    removing an edge portion of a frame of the frame-shaped structure to form the convex structure.

3. The method for packaging an OLED display panel according to claim 2, further comprising:
    forming an adhesive on the cover plate, wherein a recess of the concave structure corresponds to the adhesive in location and size such that the adhesive is accommodated in the recess after the substrate and the cover plate are bonded together.

4. The method for packaging an OLED display panel according to claim 1, wherein forming another covering layer on the cover plate comprises:
    forming a third covering layer as a frame-shaped structure on the cover plate; and
    disposing a fourth covering layer on a central portion of the third covering layer such that the third covering layer and the fourth covering layer form the convex structure.

5. The method for packaging an OLED display panel according to claim 4, wherein forming the covering layer or the another covering layer includes using a mask plate having a hollowed-out portion; and the method further comprises depositing the covering layer or the another covering layer at the hollowed-out portion.

6. The method for packaging an OLED display panel according to claim 1, wherein:

forming the covering layer or the another covering layer includes using a mask plate having a hollowed-out portion; and the covering layer or the another covering layer is deposited at the hollowed-out portion.

7. The method for packaging an OLED display panel according to claim 1, further comprising:

forming an adhesive on the cover plate, wherein a recess of the concave structure corresponds to the adhesive in location and size such that the adhesive is accommodated in the recess after the substrate and the cover plate are bonded together.

8. The method for packaging an OLED display panel according to claim 1, wherein a recess of the concave structure corresponds to a bump of the convex structure in location and size such that the bump is accommodated in the recess after the substrate and the cover plate are bonded together.

9. The method for packaging an OLED display panel according to claim 1, wherein the substrate is an array substrate, the substrate and the cover plate include glass, the covering layer includes a silicon-containing oxide, and the method further comprises:

disposing an organic light-emitting material on the substrate;

bonding the substrate and the cover plate together;

sintering;

cutting the bonded substrate and cover plate into panels;

disposing a curable auxiliary adhesive around a bonding location of the panel; and forming an auxiliary adhesive layer by curing the auxiliary adhesive.

10. An OLED display panel, comprising:

a substrate;

a covering layer positioned on the substrate;

a cover plate; and another covering layer positioned between the cover plate and the covering layer positioned on the substrate, wherein the covering layer positioned on the substrate has a concave structure, the another covering layer has a convex structure, a bump of the convex structure is accommodated in a recess of the concave structure, the substrate and the cover plate comprise glass, and the covering layer comprises a silicon-containing oxide.

11. The OLED display panel according to claim 10, further comprising an adhesive between the cover plate and the covering layer, wherein the adhesive is accommodated in the recess of the concave structure.

12. An OLED display device, comprising a display and the OLED display panel according to claim 11.

13. An OLED display device, comprising a display and the OLED display panel according to claim 10.

14. An OLED display device, comprising a display and the OLED display panel according to claim 10.

* * * * *